United States Patent Office 2,871,111

Patented Jan. 27, 1959

2,871,111

TREATMENT OF SEMICONDUCTIVE MATERIAL

Donald D. Bacon, Summit, and Jack H. Scaff, Bernardsville, N. J., and Henry C. Theuerer, New York, N. Y., assignors to Bell Telephone Laboratories, Incorporated, New York, N. Y., a corporation of New York No Drawing. Application November 25, 1957
Serial No. 698,393

4 Claims. (Cl. 41—42)

This invention relates to the preparation of semiconductive bodies destined for use in semiconductive devices, and more particularly to such bodies which contain silicon.

In a semiconductive device, a signal is generally transmitted by diffusion or drift of holes and electrons through part or all of the body comprising the particular device. These hole and electron carriers are continually recombining, and the length of time a minority charge carrier remains in the uncombined or free state after it is injected into a semiconductive body is usually called the minority charge carrier lifetime.

A high minority charge carrier lifetime is highly desirable in devices such as junction transistors since the current amplification of these devices increases with lifetime. Current amplification in a junction transistor is the ratio of the number of injected minority carriers which reach the collector to the total number of minority carriers injected into the base zone from the emitter. Current amplification in transistors is generally less than unity because of recombination which occurs in the base zone.

In the fabrication of certain types of semiconductive devices a high temperature step is necessary for forming rectifying junctions by either diffusion or alloying procedures. Such a high temperature step follows the steps of handling, cutting, grinding, and etching the semiconductive body in the usual fabrication techniques. It is well known in the art that the lifetime of semiconductive bodies, especially silicon, is substantially lowered by such a heating step. Such lifetime loss is primarily responsible for the fact that silicon bodies fabricated in accordance with the usual techniques have lifetimes of the order of only one to three microseconds. The practice of this invention increases the lifetime of silicon which is heated during the course of the usual fabrication procedure.

It has been discovered that treating the surface of a semiconductive material, for example, silicon, with a basic solution containing a beta-diketone, as, for example, 2–4 pentanedione, decreases the loss in lifetime normally associated with the high temperature step which is required in device fabrication techniques. In one instance, a silicon body which was treated in accordance with this invention prior to heating to an elevated temperature was found to have a minority carrier lifetime of 15 microseconds after heating.

The invention will be better understood from the following more detailed description.

In an illustrative example of the invention, a bar of silicon which had been etched in a hydrofluoric acid-nitric acid etchant was first rinsed in deionized water. This rinse was followed by washing in p-dioxane, a water-miscible, low dielectric constant, organic solvent. The silicon was then contacted with a solution comprising tetramethyl ammonium hydroxide, 2–4 pentanedione, and ethyl alcohol for a period of sixteen hours. The exact composition of the solution used was as follows: 5 grams of a 10% aqueous solution of tetramethyl ammonium hydroxide was added to 1 gram of 2–4 pentanedione and this mixture was diluted with 5 cubic centimeters of ethyl alcohol. The resulting mixture was further diluted with 100 cubic centimeters of ethyl alcohol. Following the treatment in the 2–4 pentanedione solution the bar was thoroughly washed in p-dioxane. After heating the silicon to approximately 1100° C. and cooling to room temperature slowly, the silicon was found to have a lifetime of 15 microseconds. This treatment has been found effective on both n-type and p-type silicon whose resistivities range from about 20 to greater than 200 ohm-centimeters.

Processing semiconductive material in accordance with the present invention is believed to remove impurities such as copper, gold, and iron, from the surface of the material and thus prevent their diffusion into the body during the high temperature step. Such impurities act as recombination centers in semiconductive material thereby decreasing the minority carrier lifetime. It is hypothesized, by reason of the materials found suitable for the practice of this invention, that these impurities are removed from the surface by chelating action. 2–4 pentanedione is a well-known chelating agent which forms a stable complex with copper and similar metallic ions in basic solutions. Furthermore, the success of the use of the low dielectric constant materials, such as ethyl alcohol and p-dioxane, in which metal complex rings are known to be exceedingly stable, is further evidence that chelation is taking place. However, it does not appear that the success of this invention in improving the lifetime of silicon can be attributed solely to the removal of metallic impurities from the surface of the semiconductive material by chelating action. Several well-known chelating agents such as ethylenediaminetetraacetic acid and other amino acid type chelating agents have proven unsuccessful when substituted for the 2–4 pentanedione used herein. It is believed that the mild etching action of the tetramethyl ammonium hydroxide is an important factor in the success of the process of this invention.

In the treating solution of the illustrative embodiment the tetramethyl ammonium hydroxide is used in the form of a 10% aqueous solution. This concentration was chosen by reason of convenience and also represents a practical upper limit. The use of an appreciably stronger concentration has the disadvantage of causing substantial etching of the silicon body being treated. Such substantial etching is undesirable because of the large volume of reaction products produced which tend to interfere with the treating process. The preferred lower limit of the concentration of the aqueous solution of tetramethyl ammonium hydroxide is 1%, such limit being fixed by virtue of the fact that weaker solutions are not conveniently prepared.

The treating solution of the illustrative embodiment described above contained one gram of 2–4 pentanedione. Although a treating solution containing larger amounts of the pentanedione is suitable for the purpose of this invention, it does not appear that any additional advantage is gained by such use. The lower limit with respect to this ingredient is determined by considerations of convenience. The pentanedione is handled in the form of an alcohol solution. The lowest quantity of such alcoholic solution which can be conveniently added to the treating solution contains approximately 1/10 gram of 2–4 pentanedione. However, the invention can be successfully practiced utilizing smaller amounts of this constituent.

Ethyl alcohol has been found to provide good solvent action for the ingredients of the treating solution. A water-miscible organic solvent of this type is required to form a completely homogenous solution with the aqueous tetramethyl ammonium hydroxide and the 2–4 pentanedione. Other solvents such as methyl alcohol or acetone are suitable substitutes for the ethyl alcohol.

In the example described above p-dioxane is used after the rinse in deionized water primarily to eliminate water from the surface of the semiconductive material. Other low dielectric constant, water-miscible solvents such as ethyl alcohol, methyl alcohol, or acetone are suitable for this step of the process. This step is not essential to the success of the invention but is considered as a rinsing step which may also remove material not removed by the water rinse.

The p-dioxane rinse after treating in the pentanedione solution is for the purpose of removing reaction products from the surface of the bar which were formed during the time the bar was immersed in the pentanedione solution. Other low dielectric, water-miscible solvents are suitable as substitutes for the p-dioxane in this step.

Other beta-diketones which are known to act similarly to 2–4 pentanedione with respect to chelating reactions are suitable for use in this process. Examples of such materials are benzoyl acetone, dibenzoylmethane, and furoyl acetone.

The efficiency of the process of this invention in improving the lifetime of semiconductive material increases with the time the material is in contact with the beta-diketone solution. Therefore, the upper and lower limits of time are determined by a balance of the lifetime required in the particular device and the economics involved.

It is to be recognized by a worker skilled in the art that although this invention is of special importance in the instance where the semiconductive body is to be subjected to an elevated temperature, the invention is essentially a surface cleaning method which depends upon the action of a beta-diketone in combination with tetramethyl ammonium hydroxide.

It is to be understood that processes of the present invention may be varied by one skilled in the art without departing from the spirit and scope of the invention. For example, the processes of this invention are not limited to silicon, but are equally applicable to the treatment of silicon-germanium alloys and other extrinsic semiconductive material containing silicon.

Two examples of the use of processes of the present invention are set forth below:

*Example 1*

A bar of n-type silicon of resistivity greater than 20-ohm centimeters and lifetime greater than 100 microseconds was etched in an etchant comprising nitric and hydrofluoric acids. After etching the bar was thoroughly rinsed in deionized water, and then was rinsed in p-dioxane. The bar was then immersed in a solution of the following composition for a period of approximately 16 hours: 5 grams of a 10% aqueous solution of tetramethyl ammonium hydroxide was added to 1 gram of 2–4 pentanedione, the mixture diluted with 5 cubic centimeters of ethyl alcohol, and then further diluted with 100 cubic centimeters of ethyl alcohol.

The bar was then rinsed in p-dioxane, dried, and heated to a temperature of approximately 1100° C. for approximately 10 minutes. The bar of silicon so treated was found to have a lifetime of 15 microseconds. Silicon merely etched and then heated in the manner described above results in a lifetime of the order of one to three microseconds. Thus this invention produces a substantial increase in lifetime in a bar of silicon treated in accordance therewith.

*Example 2*

A bar of silicon as described in Example 1 was etched in an etchant comprising nitric acid and hydrofluoric acid, and then rinsed in deionized water. The bar was then sand blasted to produce a fresh, uniform, mat surface. The bar was rinsed in p-dioxane following the sand blasting, and immersed in a solution of composition as set forth in Example 1 for a period of 16 hours. The bar was then rinsed in p-dioxane, and heated to a temperature of approximately 1100° C. for a period of approximately 10 minutes. The lifetime of the bar so treated was found to be 15 microseconds.

What is claimed is:

1. A process for treating a semiconductive body containing silicon which comprises the step of contacting the surface of said body with a basic solution comprising tetramethyl ammonium hydroxide, a beta-diketone, and a low dielectric constant liquid which is a solvent for the said beta-diketone and said tetramethyl ammonium hydroxide, and rinsing said body in a low dielectric constant liquid.

2. The process of claim 1 in which the beta-diketone is 2–4 pentanedione.

3. The process of claim 1 in which said solution comprises 5 parts by weight of a 10% aqueous solution of tetramethyl ammonium hydroxide, 1 part by weight of 2–4 pentanedione.

4. The process of claim 3 in which prior to the step of contacting the surface of said silicon body with said solution the body is etched in an etchant comprising nitric and hydrofluoric acids, rinsed in deionized water, and rinsed in p-dioxane.

No references cited.